US010515864B2

(12) United States Patent
Hanawa et al.

(10) Patent No.: US 10,515,864 B2
(45) Date of Patent: Dec. 24, 2019

(54) GLASS SUBSTRATE AND LAMINATED SUBSTRATE

(71) Applicant: AGC Inc., Chiyoda-ku, Tokyo (JP)

(72) Inventors: Yu Hanawa, Tokyo (JP); Shigeki Sawamura, Tokyo (JP); Shuhei Nomura, Tokyo (JP); Kazutaka Ono, Tokyo (JP); Nobuhiko Takeshita, Tokyo (JP); Keisuke Hanashima, Tokyo (JP)

(73) Assignee: AGC Inc., Tokyo (JP)

( * ) Notice: Subject to any disclaimer, the term of this patent is extended or adjusted under 35 U.S.C. 154(b) by 146 days.

(21) Appl. No.: 15/822,859

(22) Filed: Nov. 27, 2017

(65) Prior Publication Data
US 2018/0082914 A1   Mar. 22, 2018

Related U.S. Application Data

(63) Continuation of application No. PCT/JP2016/065308, filed on May 24, 2016.

(30) Foreign Application Priority Data

May 28, 2015   (JP) .................. 2015-109200

(51) Int. Cl.
*B32B 15/04* (2006.01)
*B32B 17/06* (2006.01)
(Continued)

(52) U.S. Cl.
CPC ............. *H01L 23/15* (2013.01); *C03C 17/22* (2013.01); *H01L 23/13* (2013.01)

(58) Field of Classification Search
USPC .................. 428/426, 428, 432, 688
See application file for complete search history.

(56) References Cited

U.S. PATENT DOCUMENTS 5,907,770 A * 5/1999 Yamazaki ............ H01L 21/2026
                                                          438/149
6,611,317 B1 * 8/2003 Ogawa ................. G03F 7/70058
                                                          355/30
(Continued)

FOREIGN PATENT DOCUMENTS

CN   103213371 A   7/2013
CN   103811394 A   5/2014
(Continued)

OTHER PUBLICATIONS

International Search Report dated Aug. 16, 2016 in PCT/JP2016/065308, filed on May 24, 2016 (with English Translation).
(Continued)

*Primary Examiner* — Lauren R Colgan
(74) *Attorney, Agent, or Firm* — Oblon, McClelland, Maier & Neustadt, L.L.P.

(57) ABSTRACT

The present invention provides a glass substrate in which in a step of sticking a glass substrate and a silicon-containing substrate to each other, bubbles hardly intrude therebetween. The present invention relates to a glass substrate for forming a laminated substrate by lamination with a silicon-containing substrate, having a warpage of 2 μm to 300 μm, and an inclination angle due to the warpage of 0.0004° to 0.12°.

17 Claims, 3 Drawing Sheets

(51) Int. Cl.
*H01L 23/15* (2006.01)
*C03C 17/22* (2006.01)
*H01L 23/13* (2006.01)

(56) References Cited

U.S. PATENT DOCUMENTS

| | | | | |
|---|---|---|---|---|
| 7,183,178 | B2* | 2/2007 | Arai | H01L 21/304 |
| | | | | 257/E21.237 |
| 7,331,780 | B2* | 2/2008 | Adachi | H01L 21/67103 |
| | | | | 432/253 |
| 2002/0127821 | A1* | 9/2002 | Ohya | C09J 7/00 |
| | | | | 438/459 |
| 2004/0229444 | A1* | 11/2004 | Couillard | H01L 21/2007 |
| | | | | 438/455 |
| 2005/0233548 | A1* | 10/2005 | Arai | H01L 21/304 |
| | | | | 438/459 |
| 2006/0179879 | A1* | 8/2006 | Ellison | C03B 19/1415 |
| | | | | 65/17.4 |
| 2011/0233562 | A1* | 9/2011 | Harada | H01L 29/808 |
| | | | | 257/77 |
| 2011/0256344 | A1* | 10/2011 | Ono | C03C 3/076 |
| | | | | 428/131 |
| 2012/0111406 | A1* | 5/2012 | Sawada | C03C 17/2456 |
| | | | | 136/256 |
| 2012/0182622 | A1* | 7/2012 | Takata | C03B 19/1453 |
| | | | | 359/639 |
| 2012/0302063 | A1* | 11/2012 | Markham | B24B 1/00 |
| | | | | 438/692 |
| 2013/0181233 | A1* | 7/2013 | Doany | H01L 21/76251 |
| | | | | 257/88 |
| 2014/0323286 | A1* | 10/2014 | Aitken | C03C 3/091 |
| | | | | 501/66 |
| 2015/0166405 | A1* | 6/2015 | Murata | C03C 3/083 |
| | | | | 428/410 |

FOREIGN PATENT DOCUMENTS

| | | |
|---|---|---|
| TW | 201139304 | 11/2011 |
| WO | WO 2014/025068 A2 | 2/2014 |
| WO | WO 2014/181790 A1 | 11/2014 |
| WO | WO 2015/037478 A1 | 3/2015 |

OTHER PUBLICATIONS

Written Opinion dated Aug. 16, 2016 in PCT/JP2016/065308, filed on May 24, 2016.

* cited by examiner

GLASS SUBSTRATE AND LAMINATED SUBSTRATE

TECHNICAL FIELD

The present invention relates to a glass substrate and a laminated substrate.

BACKGROUND ART

In the field of semiconductor devices, while the degree of integration of the devices is increased, miniaturization thereof is advanced. Associated therewith, there is an increasing demand for packaging technology of the highly integrated devices. In the semiconductor assembly process so far, a series of assembly processes in which after cutting a glass substrate and a silicon-containing substrate in a wafer state, respectively, the above-described glass substrate and the above-described silicon-containing substrate are stuck to each other, followed by die bonding, wire bonding, molding and so on, are performed.

In recent years, the wafer-level package technology in which an assembly process of sticking a glass substrate and a silicon-containing substrate to each other in a wafer state is performed, followed by cutting is in the limelight. For example, Patent Document 1 proposes a supporting glass substrate used in a wafer-level package.

BACKGROUND ART DOCUMENT

Patent Document

Patent Document 1: WO 2015/037478

SUMMARY OF THE INVENTION

Problems that the Invention is to Solve

When a glass substrate having a smooth surface is used in a wafer-level package, in a step of sticking the glass substrate and a silicon-containing substrate to each other, air between the above-described glass substrate and the above-described silicon-containing substrate is hardly removed to tend to remain as bubbles. The substrates are hardly stuck to each other at a part where the bubbles remain.

Then, the present invention provides a glass substrate in which in a step of sticking a glass substrate and a silicon-containing substrate to each other, bubbles hardly intrude therebetween.

Means for Solving the Problems

A glass substrate of the present invention is a glass substrate for forming a laminated substrate by lamination with a silicon-containing substrate, having a warpage of 2 μm to 300 μm and an inclination angle due to the warpage of 0.0004° to 0.12°.

In addition, a laminated substrate of the present invention includes the glass substrate and a silicon-containing substrate.

In the present specification, the content of each of the components in the glass substrate and in a method for producing the same is expressed in terms of a molar percentage based on oxides unless otherwise indicated.

Advantage of the Invention

In a glass substrate according to an embodiment of the present invention, since a warpage is 2 μm to 300 μm and an inclination angle due to the warpage is 0.0004° to 0.12°, sticking can be performed while removing air outside, in a step of sticking the glass substrate and a silicon-containing substrate to each other, and therefore, bubbles hardly intrude therebetween to cause the substrates to be easily stuck to each other.

BRIEF DESCRIPTION OF THE DRAWINGS

FIGS. 1A and 1B each show a glass substrate according to an embodiment of the present invention to be stuck to a silicon-containing substrate, in which FIG. 1A is a cross-sectional view before sticking, and FIG. 1B is a cross-sectional view after sticking.

FIGS. 4A and 4B each show a glass substrate according to an embodiment of the present invention and supporting members in a sag amount measuring device, in which FIG. 4A is a top view, and FIG. 4B is a cross-sectional view.

MODE FOR CARRYING OUT THE INVENTION

An embodiment of the present invention is hereunder described in detail with reference to the drawings.

Figure 1A:
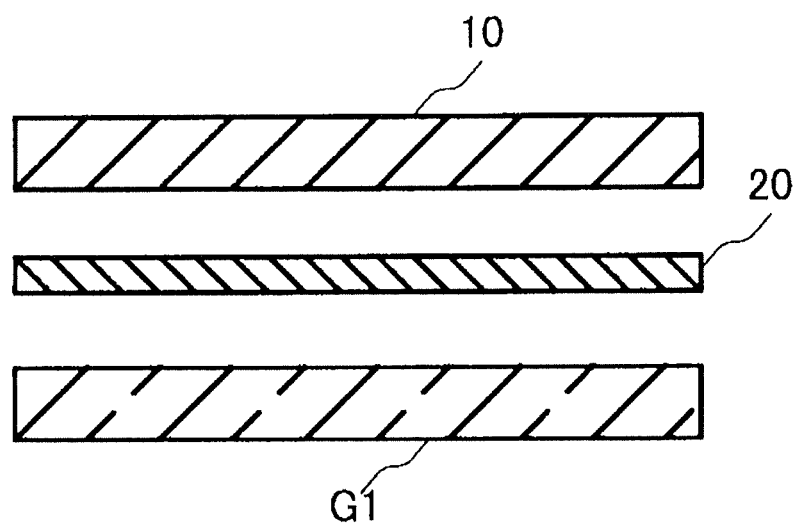
Figure 1B:
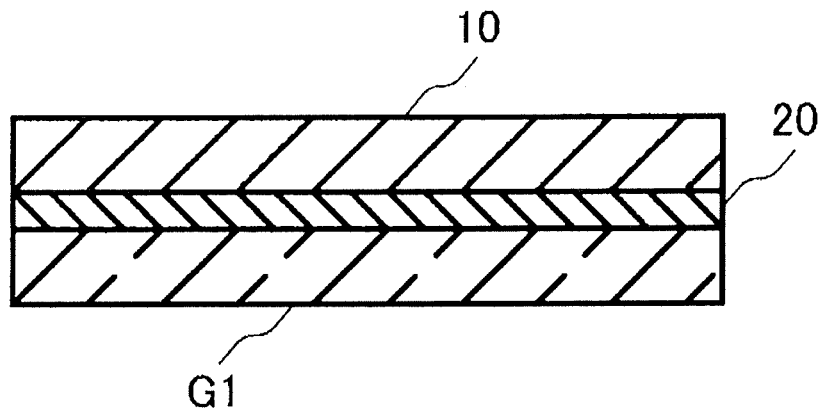

FIGS. 1A and 1B are each a cross-sectional view showing a glass substrate according to an embodiment of the present invention to be stuck to a silicon-containing substrate. A glass substrate G1 as shown in FIG. 1A is stuck to a silicon-containing substrate 10 with the interposition of a resin 20 therebetween, for example, at an atmospheric temperature of 200° C. to 400° C. to obtain a laminated substrate 30 as shown in FIG. 1B. As the silicon-containing substrate 10, there is used, for example, a wafer (for example, a silicon wafer), a wafer on which an element is formed, a substrate in which a chip obtained by cutting an element out of a wafer is molded with a resin, or the like. The resin 20 is one which withstands, for example, a temperature of 200° C. to 400° C.

The glass substrate according to an embodiment of the present invention is suitable as a supporting glass substrate for a fun-out type wafer-level package. In addition, it is suitable as a glass substrate for image sensors such as MEMS, CMOS and CIS, for which miniaturization of element due to a wafer-level package is effective, a bored substrate of a glass interposer (GIP) and a support glass for semiconductor back-grinding.

Figure 2:
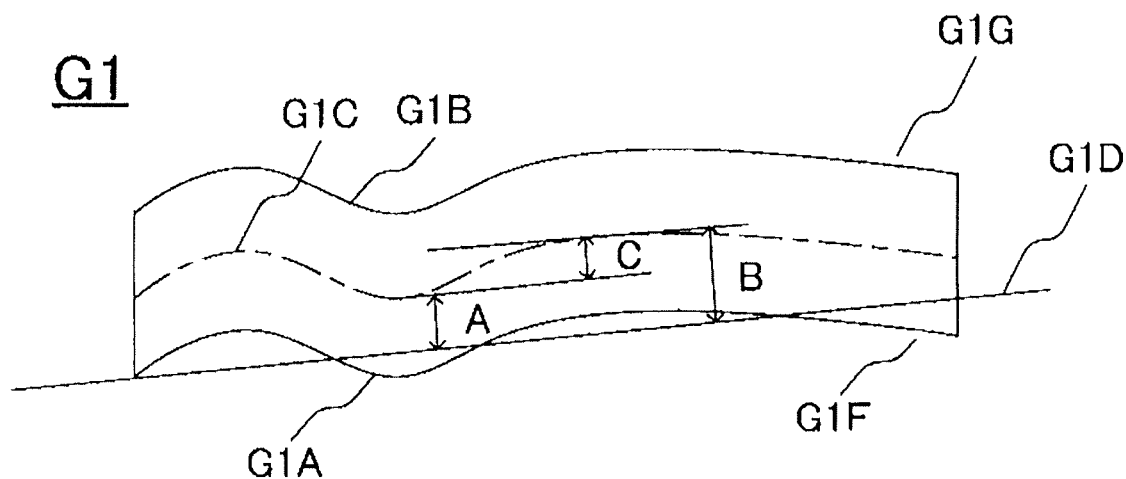
FIG. 2 is a cross-sectional view of a glass substrate according to an embodiment of the present invention.

FIG. 2 is a cross-sectional view of the glass substrate G1 according to an embodiment of the present invention. The term "warpage" is a difference C between a maximum value B and a minimum value A of a vertical distance between a reference line G1D of the glass substrate G1 and a center line G1C of the glass substrate G1, in an arbitrary cross section passing through a center of one main surface G1F of the glass substrate G1 and orthogonal to the one main surface G1F of the glass substrate G1.

A crossing line of the above-described orthogonal arbitrary cross section and the one main surface G1F of the glass substrate G1 is assumed to be a bottom line G1A. A crossing line of the above-described orthogonal arbitrary cross section and the other one main surface G1G of the glass substrate G1 is assumed to be a top line G1B. The term "center line G1C" as referred to herein is a line which connects centers in a thickness direction of the glass substrate G1. The center line G1C is calculated by determining midpoints to a laser irradiation direction described later between the bottom line G1A and the top line G1B.

The reference line G1D is determined as described below. First, the bottom line G1A is calculated under a measuring method in which a gravitational influence is cancelled. From the bottom line G1A, a straight line is determined by a least squares method. The straight line determined is the reference line G1D. As the measuring method in which a gravitational influence is cancelled, a known method is used.

For example, the one main surface G1F of the glass substrate G1 is supported at three points, and laser is irradiated to the glass substrate G1 with a laser displacement gauge, thereby measuring the heights of the one main surface G1F and the other one main surface G1G of the glass substrate G1 from an arbitrary reference surface.

Then, the glass substrate G1 is inverted, and supported at three points of the main surface G1G facing the three points supporting the main surface G1F, thereby measuring the heights of the one main surface G1F and the other one main surface G1G of the glass substrate G1 from an arbitrary reference surface.

The gravitational influence is cancelled by determining the average of the heights of respective measurement points before and after the inversion. For example, before the inversion, the height of the main surface G1F is measured as described above. After the inversion of the glass substrate G1, the height of the main surface G1G is measured at a position corresponding to the measurement point of the main surface G1F. Similarly, before the inversion, the height of the main surface G1G is measured. After the inversion of the glass substrate G1, the height of the main surface G1F is measured at a position corresponding to the measurement point of the main surface G1G.

The warpage is measured, for example, with the laser displacement gauge.

The glass substrate according to an embodiment of the present invention has a warpage of 2 μm to 300 μm. When the warpage is 2 μm or more, in a step of sticking the glass substrate and the silicon-containing substrate to each other, bubbles hardly intrude therebetween. The warpage is preferably 4 μm or more, more preferably 6 or more, and still more preferably 8 μm or more. When the warpage is 300 μm or less, since consistency with the silicon-containing substrate (ease of fitting to the silicon-containing substrate) is satisfactory, the glass substrate and the silicon-containing substrate are easily stuck to each other. In addition, when the warpage is 300 μm or less in the case of being used as a support glass for semiconductor back-grinding, cracking hardly occurs in polishing. The warpage is preferably 200 μm or less, more preferably 100 μm or less, and still more preferably 50 μm or less.

The terms "A to B" expressing the above-described numerical value range are used in order to mean that the numerical values A and B described before and after "to" are included as a lower limit value and an upper limit value. In the following present specification, the terms "A to B" are used as the same meanings unless otherwise indicated.

Figure 3:
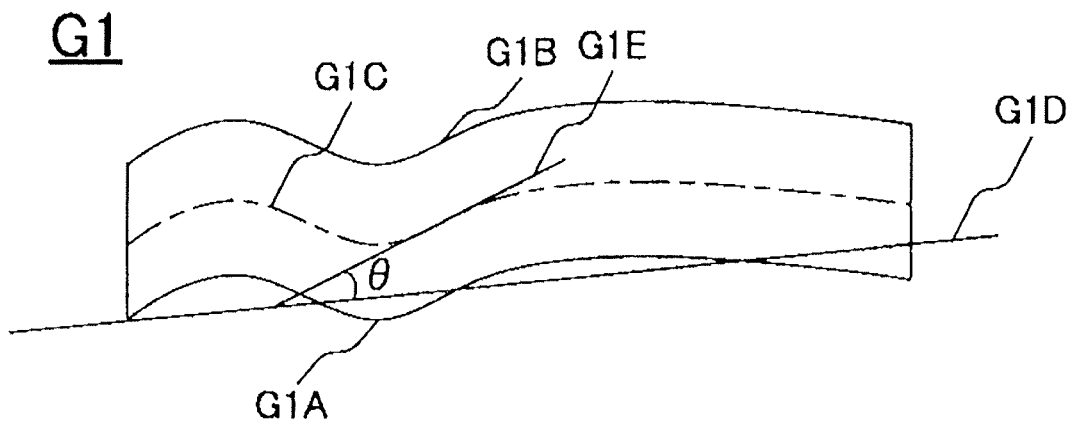
FIG. 3 is a cross-sectional view of a glass substrate according to an embodiment of the present invention.

The glass substrate according to an embodiment of the present invention has an inclination angle due to the warpage of 0.0004° to 0.12°. FIG. 3 is a cross-sectional view of the glass substrate G1 according to an embodiment of the present invention, and shows the same cross section as in FIG. 2.

The term "inclination angle due to the warpage" is a maximum angle θ formed by the reference line G1D and a tangent G1E of the center line G1C, in an arbitrary cross section passing through the center of the one main surface G1F of the glass substrate G1 and orthogonal to the one main surface G1F of the glass substrate G1.

When the inclination angle due to the warpage is 0.0004° or more, in the step of sticking the glass substrate and the silicon-containing substrate to each other, bubbles hardly intrude therebetween. The inclination angle due to the warpage is preferably 0.0008° or more, more preferably 0.001° or more, and still more preferably 0.0015° or more.

When the inclination angle due to the warpage is 0.12° or less, since the consistency with the silicon-containing substrate is satisfactory, the glass substrate and the silicon-containing substrate are easily stuck to each other. The inclination angle due to the warpage is preferably 0.06° or less, more preferably 0.04° or less, and still more preferably 0.02° or less.

In the glass substrate according to an embodiment of the present invention, a product $W \times \theta_W$ of the warpage W (unit: μm) and the inclination angle θw (unit: °) due to warpage is preferably 0.0008 to 36. When $W \times \theta_W$ is 0.0008 or more, in the step of sticking the glass substrate and the silicon-containing substrate to each other, bubbles hardly intrude therebetween. $W \times \theta_W$ is preferably 0.01 or more, and more preferably 0.1 or more.

When $W \times \theta_W$ is 36 or less, since the consistency with the silicon-containing substrate is satisfactory, the glass substrate and the silicon-containing substrate are easily stuck to each other. $W \times \theta_W$ is preferably 20 or less, and more preferably 10 or less.

The glass substrate according to an embodiment of the present invention preferably has an area of the one main surface thereof of 70 $cm^2$ to 2000 $cm^2$. When the area of the one main surface of the glass substrate is 70 $cm^2$ or more, the silicon-containing substrate containing many silicon elements can be arranged to improve productivity in a step of laminating the glass substrate and the silicon-containing substrate. The area of the one main surface is more preferably 80 $cm^2$ or more, still more preferably 170 $cm^2$ or more, especially preferably 300 $cm^2$ or more, and most preferably 700 $cm^2$ or more.

When the area of the one main surface is 2000 $cm^2$ or less, handling of the glass substrate becomes easy, and breakage to be caused by contact with the silicon-containing substrate, peripheral members or the like can be suppressed. The area of the one main surface is more preferably 1700 $cm^2$ or less, still more preferably 1000 $cm^2$ or less, yet still more preferably 800 $cm^2$ or less, and especially preferably 750 $cm^2$ or less.

A shape of the glass substrate according to an embodiment of the present invention is preferably a circular shape. In the case of the circular shape, lamination with the silicon-containing substrate is easy. In particular, lamination with the circular silicon-containing substrate is easy. The circular shape as referred to herein includes not only a complete circle but also the case where the dimensional difference from the complete circle having the same diameter is 50 μm or less.

The glass substrate according to an embodiment of the present invention may be not only circular, but also rectangular, and a notch may be provided in an end of the glass substrate. In the case of the circular shape, a part of an outer periphery thereof may be a straight line. When it is rectangular, many glass substrates can be obtained, compared with the case of the circular shape having the same area.

The glass substrate according to an embodiment of the present invention preferably has a diameter of 3 inches or more, in the case of the circular shape. When the diameter thereof is 3 inches or more, the silicon-containing substrate containing many silicon elements can be arranged to improve the productivity in the step of laminating the glass substrate and the silicon-containing substrate. The diameter thereof is more preferably 4 inches or more, still more preferably 6 inches or more, yet still more preferably 8 inches or more, and especially preferably 10 inches or more.

In addition, the diameter of the glass substrate is preferably 18 inches or less. When the diameter thereof is 18 inches or less, the handling of the glass substrate becomes easy, and the breakage to be caused by contact with the silicon-containing substrate, the peripheral members or the like can be suppressed. The diameter thereof is more preferably 13 inches or less, still more preferably 12.5 inches or less, and especially preferably 12.1 inches or less.

The glass substrate according to an embodiment of the present invention preferably has a thickness of 2.0 mm or less. When the thickness thereof is 2.0 mm or less, the laminated substrate in which the glass substrate and the silicon-containing substrate are stuck to each other can be miniaturized (made thin). The thickness is more preferably 1.5 mm or less, still more preferably 1.0 mm or less, and especially preferably 0.8 mm or less.

In addition, the thickness of the glass substrate is preferably 0.1 mm or more. When the thickness thereof is 0.1 mm or more, the breakage to be caused by contact with the silicon-containing substrate, the peripheral members or the like can be suppressed. Additionally, gravitational sag of the glass substrate can be suppressed. The thickness thereof is more preferably 0.2 mm or more, and still more preferably 0.3 mm or more.

The glass substrate according to an embodiment of the present invention preferably has a thickness deviation of 1 μm to 15 μm. When the thickness deviation is 1 μm or more, in the step of sticking the glass substrate and the silicon-containing substrate to each other, bubbles hardly intrude therebetween. The thickness deviation is more preferably 1.5 μm or more, and still more preferably 2 μm or more. When the thickness deviation is 15 μm or less, since the consistency with the silicon-containing substrate is satisfactory, the glass substrate and the silicon-containing substrate are easily stuck to each other. The thickness deviation is more preferably 12 μm or less, still more preferably 10 μm or less, and especially preferably 5 μm or less.

In the glass substrate according to an embodiment of the present invention, when the area thereof is large, the warpage is liable to become large. In the glass substrate according to an embodiment of the present invention, in the case of the circular substrate having a diameter of 12 inches, the warpage is preferably 4 μm to 300 μm. When the warpage is 4 μm or more in the circular substrate having a diameter of 12 inches, in the step of sticking the glass substrate and the silicon-containing substrate to each other, bubbles hardly intrude therebetween. In the case of the circular substrate having a diameter of 12 inches, the warpage is preferably 6 μm or more, more preferably 8 μm or more, and still more preferably 10 μm or more.

In addition, when the warpage is 300 μm or less in the circular glass substrate having a diameter of 12 inches, since the consistency with the silicon-containing substrate is satisfactory, the glass substrate and the silicon-containing substrate are easily stuck to each other. Additionally, in the case of being used as the support glass for semiconductor back-grinding, when the warpage is 300 μm or less, breakage hardly occurs in polishing. In the circular glass substrate having a diameter of 12 inches, the warpage is more preferably 200 μm or less, still more preferably 100 μm or less, and especially preferably 50 μm or less.

In the glass substrate according to an embodiment of the present invention, in the case of the circular substrate having a diameter of 8 inches, the warpage is preferably 3 μm to 200 μm. When the warpage is 3 μm or more in the circular substrate having a diameter of 8 inches, in the step of sticking the glass substrate and the silicon-containing substrate to each other, bubbles hardly intrude therebetween. In the circular substrate having a diameter of 8 inches, the warpage is preferably 4 μm or more, more preferably 5 μm or more, and still more preferably 6 μm or more.

In addition, in the circular glass substrate having a diameter of 8 inches, when the warpage is 200 μm or less, since the consistency with the silicon-containing substrate is satisfactory, the glass substrate and the silicon-containing substrate are easily stuck to each other. Additionally, in the case of being used as the support glass for semiconductor back-grinding, when the warpage is 200 μm or less, breakage hardly occurs in polishing. In the circular glass substrate having a diameter of 8 inches, the warpage is more preferably 100 μm or less, still more preferably 50 μm or less, and especially preferably 40 μm or less.

In the glass substrate according to an embodiment of the present invention, in the case of the circular substrate having a diameter of 6 inches, the warpage is preferably 2 μm to 100 μm. When the warpage is 2 μm or more in the circular substrate having a diameter of 6 inches, in the step of sticking the glass substrate and the silicon-containing substrate to each other, bubbles hardly intrude therebetween. In the circular substrate having a diameter of 6 inches, the warpage is preferably 3 μm or more, more preferably 4 μm or more, and still more preferably 5 μm or more.

In addition, in the circular glass substrate having a diameter of 6 inches, when the warpage is 100 μm or less, since the consistency with the silicon-containing substrate is satisfactory, the glass substrate and the silicon-containing substrate are easily stuck to each other. Additionally, in the case of being used as the support glass for semiconductor back-grinding, when the warpage is 100 μm or less, breakage hardly occurs in polishing. In the circular glass substrate having a diameter of 6 inches, the warpage is more preferably 50 μm or less, and still more preferably 30 μm or less.

In the glass substrate according to an embodiment of the present invention, in the case of the circular shape, a value W/D given by dividing the warpage W (unit: μm) by the diameter D (unit: inch) is preferably 0.33 to 25. When W/D is 0.33 or more, in the step of sticking the glass substrate and the silicon-containing substrate to each other, bubbles hardly intrude therebetween. W/D is more preferably 0.4 or more, still more preferably 0.6 or more, and especially preferably 0.8 or more.

In addition, when W/D is 25 or less, since the consistency with the silicon-containing substrate is satisfactory, the glass substrate and the silicon-containing substrate are easily stuck to each other. Additionally, in the case of being used as the support glass for semiconductor back-grinding, when W/D is 25 or less, breakage hardly occurs in polishing. W/D is more preferably 20 or less, still more preferably 10 or less, and especially preferably 5 or less.

The glass substrate according to an embodiment of the present invention preferably has a Young's modulus of 65 GPa or more. When the Young's modulus of the glass substrate is 65 GPa or more, the warpage or cracks of the glass substrate generated in a cooling step on the occasion of producing a glass substrate can be suppressed. In addition, breakage to be caused by contact with the silicon-containing substrate or the like can be suppressed. The Young's modulus thereof is more preferably 70 GPa or more, still more preferably 75 GPa or more, and especially preferably 80 GPa or more.

In addition, the Young's modulus of the glass substrate is preferably 100 GPa or less. When the Young's modulus thereof is 100 GP or less, the glass is suppressed from becoming brittle, whereby fracture or chipping at a cutting or dicing process of the glass substrate can be suppressed. The Young's modulus thereof is more preferably 90 GPa or less, and still more preferably 87 GPa or less.

In the glass substrate according to an embodiment of the present invention, it is preferred that a shape of a cross section orthogonal to one main surface of the glass substrate and passing through a center of gravity of the one main surface is concave, and that a shape of a cross section passing through the center of gravity of the above-described one main surface and orthogonal to the above-described cross section and the above-described one main surface is convex. Specifically, arbitrary orthogonal X- and Y-axes are provided on one main surface. It is preferred that the cross section at the time when the glass is cut along the X-axis is concave, and that the cross section along the Y-axis is convex. In the case of such shapes, in the step of sticking the glass substrate and the silicon-containing substrate to each other, bubbles hardly intrude therebetween. Such shapes are easily formed by increasing the temperature difference in a thickness direction of a glass ribbon, in a forming step and the cooling step for producing the glass substrate.

In the glass substrate according to an embodiment of the present invention, it is preferred that a shape of a cross section orthogonal to one main surface of the glass substrate and passing through a center of gravity of the one main surface is concave, and that a shape of a cross section passing through the center of gravity of the above-described one main surface and orthogonal to the above-described cross section and the above-described one main surface is concave. Specifically, arbitrary orthogonal X- and Y-axes are provided on one main surface. It is preferred that the cross section at the time when the glass is cut along the X-axis is concave, and that the cross section along the Y-axis is concave. In the case of such shapes, in the step of sticking the glass substrate and the silicon-containing substrate to each other, bubbles hardly intrude therebetween. Such shapes are easily formed by decreasing the temperature difference in the thickness direction of the glass ribbon, in the forming step and the cooling step for producing the glass substrate.

Figure 4A:
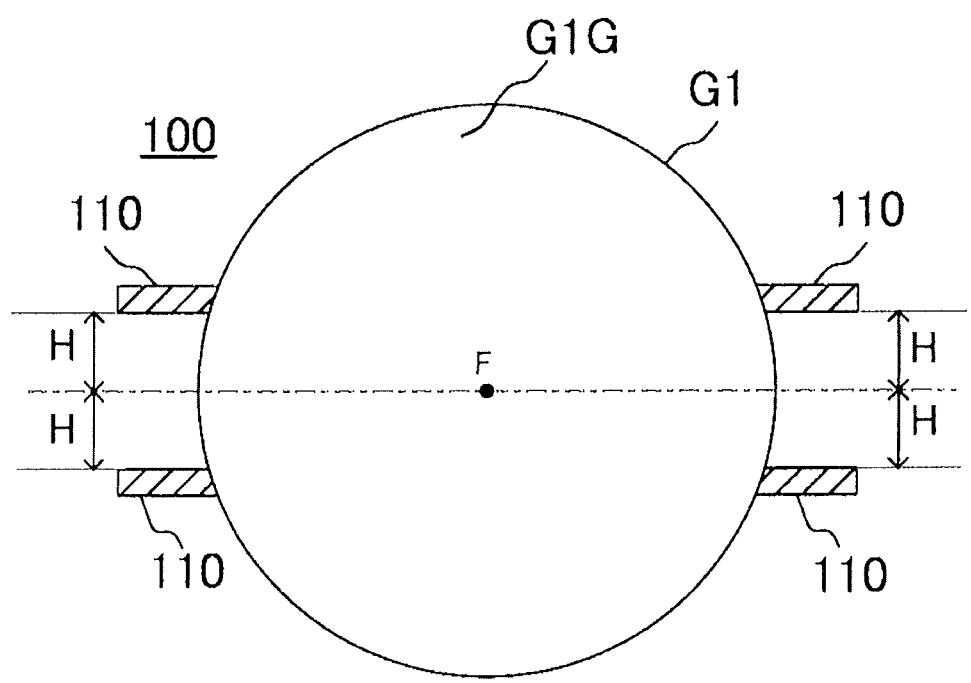
Figure 4B:
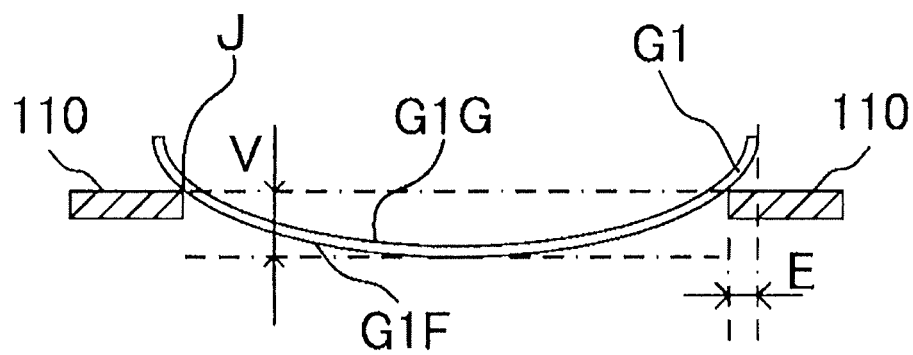

FIG. 4A is a top view showing a sag amount measuring device 100, and FIG. 4B is a cross-sectional view showing the sag amount measuring device 100. FIGS. 4A and 4B show a state where supporting members 110 constituting the sag amount measuring device 100 support a glass substrate G1. When four points of one main surface G1F of the glass substrate G1 are supported with the supporting members 110, a sag amount S is a maximum value V of vertical variations of the main surface G1F from a height level J of upper surfaces of the supporting members 110 (contact points of the upper surfaces of the supporting members 110 and the one main surface G1F of the glass substrate G1). The four supporting points are each at a position where a distance E from an end of the glass substrate G1 is 10 mm and a distance H of a vertical line to a line passing through a center F of the other one main surface G1G of the glass substrate G1 is 30 mm.

In the glass substrate according to an embodiment of the present invention, when the sag amount of the glass substrate is defined as S (unit: mm) and the thickness of the glass substrate is defined as T (unit: mm), S×T$^3$ is preferably 0.0001 to 6. When S×T$^3$ is 0.0001 or more, in the step of sticking the glass substrate and the silicon-containing substrate to each other, bubbles hardly intrude therebetween. S×T$^3$ is more preferably 0.0005 or more, and still more preferably 0.001 or more.

In addition, when S×T$^3$ is 6 or less, since the consistency with the silicon-containing substrate is satisfactory, the glass substrate and the silicon-containing substrate are easily stuck to each other. S×T$^3$ is more preferably 1 or less, still more preferably 0.1 or less, and especially preferably 0.01 or less.

The glass substrate according to an embodiment of the present invention preferably has a sag amount of 0.1 mm to 5 mm. When the sag amount of the glass substrate is 0.1 mm or more, in the step of sticking the glass substrate and the silicon-containing substrate to each other, bubbles hardly intrude therebetween. The sag amount thereof is more preferably 0.2 mm or more, still more preferably 0.3 mm or more, and especially preferably 0.5 mm or more.

In addition, when the sag amount of the glass substrate is 5 mm or less, since the consistency with the silicon-containing substrate is satisfactory, the glass substrate and the silicon-containing substrate are easily stuck to each other. The sag amount is more preferably 3 mm or less, still more preferably 2 mm or less, and especially preferably 1 mm or less.

The glass substrate according to an embodiment of the present invention preferably has an average thermal expansion coefficient at 50° C. to 350° C. of 30 ($\times 10^{-7}$/° C.) to 120 ($\times 10^{-7}$/° C.) In order to stick the silicon-containing substrate and the glass substrate to each other, a heat treatment step is required. In the heat treatment step, for example, the laminated substrate obtained by sticking the silicon-containing substrate and the glass substrate to each other at a temperature of 200° C. to 400° C. is subjected to temperature decrease to room temperature. At this time, when there is a difference in thermal expansion coefficient between the glass substrate and the silicon-containing substrate, a large residual strain (residual deformation) is caused to be generated in the silicon-containing substrate due to the difference in thermal expansion.

In addition, in the glass substrate according to an embodiment of the present invention, when used as a fun-out type wafer-level package, the silicon-containing substrate is laminated on the glass substrate, and the resin is formed so as to contact with the glass substrate and the silicon-containing substrate. In such a case, the thermal expansion coefficient of the resin also causes generation of the residual strain. When the average thermal expansion coefficient at 50° C. to 350° C. is 30 ($\times 10^{-7}$/° C.) to 120 ($\times 10^{-7}$/° C.), the residual strain generated in the silicon-containing substrate can be decreased, in the heat treatment step of sticking the silicon-containing substrate and the glass substrate to each other.

The term "average thermal expansion coefficient at 50° C. to 350° C." as referred to herein is an average thermal expansion coefficient as measured by the method prescribed in JIS R3102 (1995), in which a temperature range of measuring the thermal expansion coefficient is 50° C. to 350° C.

When the average thermal expansion coefficient at 50° C. to 350° C. is 30 ($\times 10^{-7}$/° C.) to 50 ($\times 10^{-7}$/° C.), the residual strain generated in the silicon-containing substrate in the heat treatment step is small. The average thermal expansion coefficient at 50° C. to 350° C. may be 31 ($\times 10^{-7}$/° C.) to 50

($\times 10^{-7}/°$ C.), may be 32 ($\times 10^{-7}/°$ C.) to 40 ($\times 10^{-7}/°$ C.), may be 32 ($\times 10^{-7}/°$ C.) to 36 ($\times 10^{-7}/°$ C.) or may be 34 ($\times 10^{-7}/°$ C.) to 36 ($\times 10^{-7}/°$ C.).

When the average thermal expansion coefficient at 50° C. to 350° C. is 50 ($\times 10^{-7}/°$ C.) to 80 ($\times 10^{-7}/°$ C.), the residual strain generated in the silicon-containing substrate and the resin in the heat treatment step is small.

When the average thermal expansion coefficient at 50° C. to 350° C. is 80 ($\times 10^{-7}/°$ C.) to 120 ($\times 10^{-7}/°$ C.), the residual strain generated in the resin and wiring is small.

The average thermal expansion coefficient at 50° C. to 350° C. may be 85 ($\times 10^{-7}/°$ C.) to 100 ($\times 10^{-7}/°$ C.) or may be 90 ($\times 10^{-7}/°$ C.) to 95 ($\times 10^{-7}/°$ C.).

In the glass substrate according to an embodiment of the present invention, a light shielding film is preferably formed on the main surface of the glass substrate. When the light shielding film is formed on the main surface of the glass substrate, the position of the glass substrate or the laminated substrate is easily detected in an inspection step of the glass substrate or the laminated substrate. The position is identified by reflected light due to irradiation of the glass substrate or the laminated substrate with light. Since the glass substrate easily transmits the light, the reflected light becomes strong by forming the light shielding film on the main surface of the glass substrate, and the position is easily detected. The light shielding film preferably contains Ti.

It is preferred that the glass substrate according to an embodiment of the present invention has the following composition:

$SiO_2$: 50% to 75%,
$Al_2O_3$: 0% to 16%,
$B_2O_3$: 0% to 15%,
MgO: 0% to 18%,
CaO: 0% to 13%,
SrO: 0% to 11%,
BaO: 0% to 15%,
$Na_2O$: 0% to 17%, and
$K_2O$: 0% to 15%.

$SiO_2$ is a component of forming a glass network. When the content of $SiO_2$ is 50% or more, heat resistance, chemical durability and weather resistance become satisfactory. In addition, when the content of $SiO_2$ is 50% or more, etching treatment as cleaning or recycle treatment, which is performed after peeling of the glass substrate G1 from the laminated substrate 30, is easily performed.

When the content of $SiO_2$ is 75% or less, meltability becomes satisfactory while viscosity at the time of glass melting does not become excessively high. The content of $SiO_2$ is more preferably 60% to 70%, and still more preferably 64% to 68%.

Although $Al_2O_3$ is not an essential component, when $Al_2O_3$ is contained, the weather resistance, the heat resistance and the chemical durability become satisfactory, and the Young's modulus becomes high. When the content of $Al_2O_3$ is 16% or less, the meltability becomes satisfactory while the viscosity at the time of glass melting does not become excessively high, and devitrification tendency becomes low. The content of $Al_2O_3$ is more preferably 3% to 14%, and still more preferably 6% to 14%.

Although $B_2O_3$ is not an essential component, when $B_2O_3$ is contained, the meltability becomes satisfactory while the viscosity at the time of glass melting does not become excessively high, and the devitrification tendency becomes low. When the content of $B_2O_3$ is 15% or less, a glass transition temperature of the glass substrate can be made high, and the Young's modulus becomes high. The content of $B_2O_3$ is more preferably 0% to 12%, and still more preferably 3% to 6%.

Although MgO is not an essential component, when MgO is contained, the meltability becomes satisfactory while the viscosity at the time of glass melting does not become excessively high, the weather resistance is improved, and the Young's modulus becomes high. When the content of MgO is 18% or less, the devitrification tendency becomes low. The content of MgO is more preferably 0% to 10%, still more preferably 4% to 9.5%, and especially preferably 6% to 9%.

Although CaO is not an essential component, when CaO is contained, the meltability becomes satisfactory while the viscosity at the time of glass melting does not become excessively high, and the weather resistance is improved. When the content of CaO is 13% or less, the devitrification tendency becomes low. The content of CaO is more preferably 0% to 10%, and still more preferably 4% to 8%.

Although SrO is not an essential component, when SrO is contained, the meltability becomes satisfactory while the viscosity at the time of glass melting does not become excessively high, and the weather resistance is improved. When the content of SrO is 11% or less, the devitrification tendency becomes low. The content of SrO is more preferably 0% to 8%, and still more preferably 0.5% to 3%.

Although BaO is not an essential component, when BaO is contained, the meltability becomes satisfactory while the viscosity at the time of glass melting does not become excessively high, and the weather resistance is improved. When the content of BaO is 15% or less, the devitrification tendency becomes low. The content of BaO is more preferably 0% to 9.5%, and still more preferably 0% to 3%.

Although $Na_2O$ is not an essential component, when $Na_2O$ is contained, the meltability becomes satisfactory while the viscosity at the time of glass melting does not become excessively high. When the content of $Na_2O$ is 17% or less, the weather resistance is improved. The content of $Na_2O$ is more preferably 15% or less, and still more preferably 10% or less.

In the heat treatment step of sticking the silicon-containing substrate and the glass substrate to each other, in order to prevent alkali ions from being diffused into the silicon-containing substrate, it is preferred that $Na_2O$ is not substantially contained. The term "$Na_2O$ is not substantially contained" as referred to herein means that $Na_2O$ is not contained at all, or that $Na_2O$ may be contained as an impurity which is unavoidably included on the production.

Although $K_2O$ is not an essential component, when $K_2O$ is contained, the meltability becomes satisfactory while the viscosity at the time of glass melting does not become excessively high. When the content of $K_2O$ is 15% or less, the weather resistance is improved. The content of $K_2O$ is more preferably 13% or less, and still more preferably 10% or less.

In the heat treatment step of sticking the silicon-containing substrate and the glass substrate to each other, in order to prevent alkali ions from being diffused into the silicon-containing substrate, it is preferred that $K_2O$ is not substantially contained.

In the glass substrate according to an embodiment of the present invention, a total content of MgO, CaO, SrO and BaO is preferably 7% or more. When the total content of MgO, CaO, SrO and BaO is 7% or more, the devitrification tendency becomes low. The total content of MgO, CaO, SrO and BaO is more preferably 7.5% or more, and still more preferably 8.0% or more.

In the glass substrate according to an embodiment of the present invention, $SnO_2$, $SO_3$, Cl, F or the like may be contained as a refining agent.

In the glass substrate according to an embodiment of the present invention, in order to improve the weather resistance, solubility, devitrification properties, ultraviolet shielding, infrared shielding, ultraviolet transmission, infrared transmission and so on, ZnO, $Li_2O$, $WO_3$, $Nb_2O_5$, $V_2O_5$, $Bi_2O_3$, $MoO_3$, $P_2O_5$, $Ga_2O_3$, $I_2O_5$, $In_2O_5$, $Ge_2O_5$ and the like may be contained.

In the glass substrate according to an embodiment of the present invention, in order to improve the chemical durability, $ZrO_2$, $Y_2O_3$, $La_2O_3$, $TiO_2$ and $SnO_2$ may be contained in an amount of 2% or less, preferably 1% or less, and more preferably 0.5% or less in total. Among those, $Y_2O_3$, $La_2O_3$ and $TiO_2$ also contribute to an improvement of the Young's modulus of glass.

In the glass substrate according to an embodiment of the present invention, taking into consideration an environmental load, it is preferred that $As_2O_3$ and $Sb_2O_3$ are not substantially contained. In addition, taking into consideration stable float forming, it is preferred that ZnO is not substantially contained.

The glass substrate according to an embodiment of the present invention preferably has a β-OH of 0.05 $mm^{-1}$ to 0.65 $mm^{-1}$. The β-OH is an index indicating a water content in the glass substrate according to an embodiment of the present invention. When the β-OH is 0.05 $mm^{-1}$ or more, clarity can be improved. When the β-OH is 0.65 $mm^{-1}$ or less, the heat resistance can be increased.

The β-OH is more preferably 0.1 $mm^{-1}$ to 0.55 $mm^{-1}$, still more preferably 0.15 $mm^{-1}$ to 0.5 $mm^{-1}$, and especially preferably 0.17 $mm^{-1}$ to 0.45 $mm^{-1}$. The term "13-OH" as referred to herein is a value determined by the following formula:

$$\beta\text{-OH (mm}^{-1}) = -\log_{10}(T_{3500} \text{ cm}^{-1}/T_{4000} \text{ cm}^{-1})/t$$

In the above-described formula, $T_{3500}$ $cm^{-1}$ is a transmittance (%) at a wave number of 3500 $cm^{-1}$, $T_{4000}$ $cm^{-1}$ is a transmittance (%) at a wave number of 4000 $cm^{-1}$, and t is a thickness (mm) of the glass substrate.

The glass substrate according to an embodiment of the present invention preferably has a density of 2.60 $g/cm^3$ or less. When the density of the glass substrate is 2.60 $g/cm^3$ or less, the glass substrate is lightweight. In addition, gravitational sag of the glass substrate can be reduced. The density thereof is more preferably 2.55 $g/cm^3$ or less, and still more preferably 2.50 $g/cm^3$ or less.

The density of the glass substrate is preferably 2.20 $g/cm^3$ or more. When the density is 2.20 $g/cm^3$ or more, a Vickers hardness of the glass becomes high, so that the glass surface can be made to be hardly scratched. The density thereof is more preferably 2.30 $g/cm^3$ or more, still more preferably 2.40 $g/cm^3$ or more, and especially preferably 2.45 $g/cm^3$ or more.

The glass substrate according to an embodiment of the present invention preferably has a glass transition temperature (hereinafter also referred to as Tg) of 700° C. or higher. When Tg of the glass substrate is 700° C. or higher, a dimensional change of the glass substrate in the heat treatment step can be suppressed to be small. Tg thereof is more preferably 720° C. or higher, and still more preferably 740° C. or higher.

In the glass substrate according to an embodiment of the present invention, a transmittance at a wavelength of 250 nm is preferably 10% or more. When the resin is irradiated with ultraviolet rays through the glass substrate, the glass substrate is peeled from the laminated substrate. When the transmittance at a wavelength of 250 nm in the glass substrate is 10% or more, the ultraviolet rays with which the resin is irradiated is increased to cause easy peeling of the glass substrate from the laminated substrate. The transmittance at a wavelength of 250 nm in the glass substrate is more preferably 15% or more, and still more preferably 20% or more.

In the glass substrate according to an embodiment of the present invention, a transmittance at a wavelength of 300 nm is preferably 45% or more. When the transmittance at a wavelength of 300 nm in the glass substrate is 45% or more, the ultraviolet rays with which the resin is irradiated is increased to cause easy peeling of the glass substrate from the laminated substrate. The transmittance at a wavelength of 300 nm in the glass substrate is more preferably 50% or more, still more preferably 55% or more, and especially preferably 60% or more.

In the glass substrate according to an embodiment of the present invention, a transmittance at a wavelength of 350 nm is preferably 45% or more. When the transmittance at a wavelength of 350 nm in the glass substrate is 45% or more, the ultraviolet rays with which the resin is irradiated is increased to cause easy peeling of the glass substrate from the laminated substrate. The transmittance at a wavelength of 350 nm in the glass substrate is more preferably 50% or more, still more preferably 55% or more, and especially preferably 60% or more.

In the glass substrate according to an embodiment of the present invention, a density of defects such as bubbles or impurities having a diameter of 200 μm or more is preferably 10 $pcs/cm^2$ or less. When the density of defects having a diameter of 200 μm or more is 10 $pcs/cm^2$ or less, light irradiated in a bonding step is not shielded to cause easy bonding. The density of defects having a diameter of 200 μm or more is more preferably 2 $pcs/cm^2$ or less, and it is especially preferred that the defects having a diameter of 200 μm or more are not contained.

In the glass substrate according to an embodiment of the present invention, the density of defects such as bubbles or impurities having a diameter of 20 μm or more is preferably 10 $pcs/cm^2$ or less. When the density of defects having a diameter of 20 μm or more is 10 $pcs/cm^2$ or less, light irradiated in the bonding step is not shielded to cause easy bonding. The density of defects having a diameter of 20 μm or more is more preferably 2 $pcs/cm^2$ or less, and it is especially preferred that the defects having a diameter of 20 μm or more are not contained.

The laminated substrate according to an embodiment of the present invention is formed through lamination of the above-described glass substrate and silicon-containing substrate. Since formed through lamination of the above-described glass substrate and silicon-containing substrate, bubbles hardly intrude therebetween, in the step of sticking the glass substrate and the silicon-containing substrate to each other.

The laminated substrate according to an embodiment of the present invention preferably has a thickness of 0.5 mm to 3 mm. When the thickness of the laminated substrate is 0.5 mm or more, breakage to be caused by contact with the peripheral members or the like can be suppressed. The thickness thereof is more preferably 1.0 mm or more, and still more preferably 1.3 mm or more. When the thickness thereof is 3 mm or less, miniaturization is possible. The thickness thereof is more preferably 2.5 mm or less, and still more preferably 2.0 mm or less.

The laminated substrate according to an embodiment of the present invention may be formed through lamination of a laminated substrate (hereinafter also referred to as a glass laminated substrate) obtained by laminating two or more glass substrates and the silicon-containing substrate. In the case where the laminated substrate according to an embodiment of the present invention is used as the support glass for semiconductor back-grinding, when the glass substrate is formed of one substrate, the thickness of the glass substrate (the thickness of the laminated substrate) is adjusted by polishing the glass substrate. When the laminated substrate according to an embodiment of the present invention is formed by laminating the glass laminated substrate and the silicon-containing substrate to each other, the thickness of the whole laminated substrate can be adjusted by peeling the glass substrate from the glass laminated substrate without polishing the glass substrate.

In addition, the sag amount of the glass substrate having an arbitrary thickness is larger than the sag amount of the glass laminated substrate obtained by laminating two glass substrates each having a thickness half of the thickness of the glass substrate. The sag amount of the glass laminated substrate can be adjusted by adjusting the thickness of the glass substrate and the number of laminated glass substrates.

In the laminated substrate according to an embodiment of the present invention, the warpage of the glass substrate in the laminated substrate is preferably 200 or less. When the warpage of the glass substrate in the laminated substrate is 200 µm or less, the laminated substrate is easily transported. The warpage of the glass substrate in the laminated substrate is more preferably 100 µm or less, and still more preferably 50 µm or less. The warpage of the glass substrate in the laminated substrate is determined in the same manner as in the case of the warpage of the above-described single glass substrate. When the surface of the glass substrate is supported at three points, laser is irradiated from the surface of the glass substrate.

A method for producing the glass substrate according to an embodiment of the present invention is described below.

In the case of producing the glass substrate according to an embodiment of the present invention, melting, refining forming and cooling steps are included.

In the melting step, raw materials are prepared so as to have a composition of a glass sheet to be obtained, and the raw materials are continuously put into a melting furnace and heated preferably to approximately 1450° C. to 1650° C. to obtain a molten glass.

For the raw materials, oxides, carbonates, nitrates, hydroxides, halides such as chlorides in some cases, and so on can be used. In the case where the melting or refining step includes a step where the molten glass comes into contact with platinum, there is a case where minute platinum particles elute into the molten glass and are included as an impurity into the resulting glass sheet. However, use of a nitrate raw material brings about an effect for preventing elution of this platinum impurity from occurring.

As the nitrates, strontium nitrate, barium nitrate, magnesium nitrate, calcium nitrate and so on can be used. Use of strontium nitrate is more preferred.

As for the particle size of the raw materials, from raw materials having a large particle diameter of several hundred microns to an extent of not causing an unmelted residue to raw materials having a small particle diameter of several microns to an extent that they are not scattered at the time of transportation of raw materials and are not coagulated as secondary particles can be properly used. It is also possible to use a granulated body. Melting conditions such as a moisture content, the β-OH and an oxidation-reduction degree or redox of Fe [$Fe^{2+}/(Fe^{2+}+Fe^{3+})$] can also be properly regulated and used.

The refining step is a step of removing bubbles from the molten glass obtained in the above-described melting step. As the refining step, a degassing method by means of pressure reduction may be applied. In addition, in the glass substrate in the present invention, $SO_3$ or $SnO_2$ can be used as a refining agent.

An $SO_3$ source is preferably a sulfate of at least one element selected from Al, Mg, Ca, Sr, Ba, Na and K, and more preferably a sulfate of an alkaline earth metal or an alkali metal. Above all, $CaSO_4.2H_2O$, $SrSO_4$, $BaSO_4$ and $Na_2SO_4$ are especially preferred, because their action to make the bubbles large is remarkable.

As the refining agent in the degassing method by means of pressure reduction, it is preferred to use a halogen such as Cl or F. A Cl source is preferably a chloride of at least one element selected from Al, Mg, Ca, Sr, Ba, Na and K, and more preferably a chloride of an alkaline earth metal or an alkali metal. Above all, $SrCl_2.6H_2O$, $BaCl_2.2H_2O$ and NaCl are especially preferred, because not only their action to make the bubbles large is remarkable, but also their deliquescency is small.

An F source is preferably a fluoride of at least one element selected from Al, Mg, Ca, Sr and Ba, and more preferably a fluoride of an alkaline earth metal. Above all, $CaF_2$ is especially preferred, because an action to make the solubility of the glass raw materials large is remarkable.

As the forming step, the float process of forming a molten glass into a sheet-like shape by flowing it onto a molten metal to obtain a glass ribbon is applied.

The glass ribbon is gradually cooled as the cooling step, cut out into glass sheets, and thereafter cut into a predetermined shape and size, thereby obtaining the glass substrate according to an embodiment of the present invention.

In the glass substrate according to an embodiment of the present invention, the warpage or the inclination angle due to the warpage can be increased, for example, by increasing the difference between a cooling rate at a center part of the glass ribbon in a width direction of the glass ribbon orthogonal to an advancing direction of the glass ribbon and a cooling rate at an end part of the glass ribbon, in the forming step and the cooling step.

By adjustment of the cooling rate, the warpage can be adjusted to 2 µm to 300 µm, and the inclination angle due to the warpage can be adjusted to 0.0004° to 0.12°. In addition, the warpage or the inclination angle due to the warpage can be increased by local cooling of the glass ribbon or by increasing the difference between a temperature at the center part of the glass ribbon in the width direction of the glass ribbon orthogonal to the advancing direction of the glass ribbon and a temperature at the end part of the glass ribbon, in the forming step and the cooling step.

In the glass substrate according to an embodiment of the present invention as described above, when the warpage is 2 µm to 300 µm and the inclination angle due to the warpage is 0.0004° to 0.12°, in the step of sticking the glass substrate and the silicon-containing substrate to each other, bubbles hardly intrude therebetween.

The present invention is not limited to the above-described embodiments. Modifications, improvements and the like within the range where the object of the present invention can be achieved are included in the present invention.

For example, in the case of producing the glass substrate according to an embodiment of the present invention, in the forming step, the molten glass may be formed into a sheet-like shape by applying a fusion process, a roll-out process, a press forming process or the like.

In addition, in the case of producing the glass substrate according to an embodiment of the present invention, a platinum crucible may be used. In the case of using the platinum crucible, in the melting step, raw materials are prepared so as to have a desired composition of the glass substrate, the platinum crucible having the raw materials charged therein is put into an electric furnace and heated preferably to approximately 1450° C. to 1650° C., a platinum stirrer is inserted, and stirring is performed for 1 to 3 hours to obtain a molten glass.

In the forming step, the molten glass is flown onto a carbon sheet into a sheet-like shape. In the cooling step, the glass in the sheet-like shape is gradually cooled to a room temperature state and then cut to obtain the glass substrate.

EXAMPLES

The present invention is hereunder specifically described by reference to the Examples, but it should be construed that the present invention is not limited thereto.

Examples 1 to 18 are concerned with working examples, and Examples 19 to 21 are concerned with comparative examples. Various glass raw materials such as silica sand were compounded so as to have each of glass compositions (objective compositions) as shown in Tables 1 and 2. 0.01% to 1% of a sulfate as converted into $SO_3$, 0.16% of F and 1% of Cl were added, as expressed in terms of mass percentage based on oxides relative to 100% of the raw materials of the objective composition, and each composition was melted for 3 hours under heating at a temperature of 1550° C. to 1650° C. by using a platinum crucible. In the melting, a platinum stirrer was inserted, and stirring was performed for 1 hour to achieve homogenization of glass. Subsequently, the molten glass was flown out onto a carbon sheet and formed into a sheet-like shape, thereafter, the glass in the sheet-like shape was put into an electric furnace at a temperature of approximately (Tg+50° C.), and the electric furnace was subjected to temperature decrease at a cooling rate R (° C./min) and cooled until the glass reached room temperature.

With respect to the resulting glasses, a density (unit: g/cm³), an average thermal expansion coefficient (unit: ×10⁻⁷/° C.), a glass transition temperature Tg (unit: ° C.), a Young's modulus (unit: GPa), $T_2$ (unit: ° C.), $T_4$ (unit: ° C.), a devitrification temperature (unit: ° C.) and a transmittance (unit: %) were measured and are shown in Tables 1 and 2. The values in the parentheses in the tables are those determined through calculations. The residual amount of $Fe_2O_3$ in the glass was 50 ppm to 200 ppm, and the residual amount of $SO_3$ in the glass was 10 ppm to 500 ppm. Measurement methods of the respective physical properties are shown as follows.

(Average Thermal Expansion Coefficient)

The average thermal expansion coefficient at 50° to 350° was measured by using a differential thermal expansion meter (TMA) in accordance with the method prescribed in JIS R3102 (1995).

(Glass Transition Temperature Tg)

The measurement was performed by using TMA in accordance with the method prescribed in JIS R3103-3 (2001).

(Density)

For about 20 g of a bubble-free glass lump, the measurement was performed by the Archimedean method.

(Young's Modulus)

For a glass having a thickness of 0.5 mm to 10 mm, the measurement was performed by the ultrasonic pulse method.

($T_2$)

The viscosity was measured by using a rotary viscometer, and the temperature $T_2$ (° C.) at which the viscosity reached $10^2$ dPa·sec was measured.

($T_4$)

The viscosity was measured by using a rotary viscometer, and the temperature $T_4$ (° C.) at which the viscosity reached $10^4$ dPa·sec was measured.

(Glass Devitrification Temperature)

The glass devitrification temperature is obtained in the following manner. That is, pulverized glass particles are put in a platinum-made dish and heat treated for 17 hours in an electric furnace controlled at a fixed temperature. After the heat treatment, the observation with an optical microscope is performed, and an average value between a maximum temperature at which a crystal is precipitated in the inside of the glass and a minimum temperature at which a crystal is not precipitated is defined as the devitrification temperature.

(Transmittance)

The resulting glass was mirror-polished to a thickness of 1 mm, and the transmittance at a wavelength of 300 nm was measured by a spectrophotometer.

Next, various glass raw materials such as silica sand were compounded so as to have each of glass compositions as shown in Tables 1 and 2. 0.01% to 1% of a sulfate as converted into $SO_3$ was added, as expressed in terms of mass percentage based on oxides relative to 100% of the raw materials of the objective composition, and each composition was melted at a temperature of 1550° C. to 1650° C. by using a glass melting apparatus, followed by degassing and homogenization. Then, the molten glass was formed into a sheet-like shape, gradually cooled and cut, further followed by cutting into a circular shape so as to have each of diameters shown in Tables 1 and 2 to obtain a glass substrate. A warpage or an inclination angle due to the warpage was adjusted by adjusting the difference between a temperature at a center part of a glass ribbon in a width direction of the glass ribbon orthogonal to an advancing direction of the glass ribbon and a temperature at an end part of the glass ribbon, in a forming step and a cooling step.

In the glass substrates of Examples 1 to 18, the difference between the temperature at the center part of the glass ribbon in the width direction of the glass ribbon orthogonal to the advancing direction of the glass ribbon and the temperature at the end part of the glass ribbon was made large, in the forming step and the cooling step.

In the glass substrates of Examples 19 to 20, the difference between the temperature at the center part of the glass ribbon in the width direction of the glass ribbon orthogonal to the advancing direction of the glass ribbon and the temperature at the end part of the glass ribbon was made smaller than that in the case where the glass substrates of Examples 1 to 18 were produced, in the forming step and the cooling step.

In the substrate of Example 21, the difference between the temperature at the center part of the glass ribbon in the width direction of the glass ribbon orthogonal to the advancing direction of the glass ribbon and the temperature at the end part of the glass ribbon was made larger than that in the case where the glass substrates of Examples 1 to 18 were produced, in the forming step and the cooling step.

With respect to the resulting glass substrates, a thickness T (unit: mm), a diameter D (unit: inch), an area of one main surface (unit: cm²), a thickness deviation (unit: µm), a warpage W (unit: µm) and a sag amount S (unit: µm) were measured and are shown in Tables 1 and 2. In addition, the inclination angle due to the warpage was determined, and it is shown whether or not the inclination angle is within a range of 0.0004° to 0.12°. The values in the parentheses in the tables are those determined through calculations. Measurement methods of respective physical properties are shown as follows.

(Thickness)

The thickness of the glass substrate was measured by a spectral interference laser displacement meter (manufactured by Keyence Corporation).

(Diameter)

The diameter of the glass substrate was measured by a caliper.

(Area)

The area was calculated by measuring one main surface of the glass substrate at 1-mm intervals by a noncontact laser displacement meter (Nanometro manufactured by Kuroda precision industries Ltd.).

(Thickness Deviation)

The thickness of the glass substrate was measured at 3-mm intervals by the noncontact laser displacement meter (Nanometro manufactured by Kuroda precision industries Ltd.), and the thickness deviation was calculated therefrom.

(Warpage)

The height of two main surfaces of the glass substrate was measured at 3-mm intervals by the noncontact laser displacement meter (Nanometro manufactured by Kuroda precision industries Ltd.), and the warpage was calculated by the method explained using FIG. 2 described above.

(Sag Amount)

The sag amount was measured by the noncontact laser displacement meter (Nanometro manufactured by Kuroda precision industries Ltd.) by the method explained using FIG. 4 described above.

(Inclination Angle Due to Warpage)

The height of two main surfaces of the glass substrate was measured at 3-mm intervals by the noncontact laser displacement meter (Nanometro manufactured by Kuroda precision industries Ltd.), and the inclination angle was calculated by the method explained using FIG. 3 described above.

TABLE 1

| | | Example 1 | Example 2 | Example 3 | Example 4 | Example 5 | Example 6 | Example 7 | Example 8 | Example 9 | Example 10 | Example 11 |
|---|---|---|---|---|---|---|---|---|---|---|---|---|
| Composition (mol %) | $SiO_2$ | 66.0 | 67.7 | 73.5 | 73.5 | 83.3 | 83.3 | 68.6 | 66.8 | 70.6 | 65.2 | 67.1 |
| | $Al_2O_3$ | 11.3 | 11.7 | 1.7 | 1.7 | 1.2 | 1.2 | 11.4 | 13.0 | 1.0 | 6.0 | 12.8 |
| | $B_2O_3$ | 7.8 | 8.8 | | | 11.5 | 11.5 | 7.9 | 4.6 | | | 1.2 |
| | MgO | 5.1 | 4.8 | 15.0 | 15.0 | | | 2.5 | 8.0 | 6.2 | 8.0 | 9.1 |
| | CaO | 4.6 | 5.6 | | | | | 9.1 | 6.6 | 9.2 | 7.0 | 5.4 |
| | SrO | 5.2 | | | | | | 0.5 | 1.0 | | 1.0 | 4.4 |
| | BaO | | 1.4 | | | | | 0.0 | | | | 0.0 |
| | ZnO | | | | | | | | | | | |
| | $Na_2O$ | | | 6.2 | 6.2 | 4.0 | 4.0 | | | 12.4 | 5.0 | |
| | $K_2O$ | | | 3.6 | 3.6 | | | | | 0.6 | 6.5 | |
| | $ZrO_2$ | | | | | | | | | | 1.3 | |
| | $SnO_2$ | | | | | | | | | | | |
| | MgO + CaO + SrO + BaO | 14.9 | 11.8 | 15.0 | 15.0 | 0.0 | 0.0 | 12.1 | 15.6 | 15.4 | 16.0 | 18.9 |
| Average thermal expansion coefficient ($\times 10^{-7}$/° C.) | | 38 | 34 | 70 | 70 | 33 | 33 | 34 | 35 | 85 | 84 | 39 |
| Density (g/cm$^3$) | | 2.5 | 2.41 | 2.4 | 2.4 | 2.2 | 2.2 | 2.38 | 2.47 | 2.50 | 2.55 | 2.59 |
| Glass transition temperature Tg (° C.) | | 720 | 715 | 635 | 635 | 525 | 525 | | 754 | 550 | 645 | |
| Young's modulus (GPa) | | 77 | 73.5 | 73.5 | 73.5 | 63 | 63 | 73 | 84.6 | 73 | 77 | 86 |
| $T_2$ (° C.) | | 1645 | (1669) | 1687 | 1687 | | | 1692 | 1647 | 1461 | 1599 | 1654 |
| $T_4$ (° C.) | | 1275 | (1273) | 1249 | 1249 | 1252 | 1252 | 1296 | 1294 | 1039 | 1178 | 1298 |
| Devitrification temperature (° C.) | | | | <1240 | <1240 | | | | | 1305 | | |
| Transmittance [300 nm] (% @1 mmt) | | 10 | 50 | | | 70 | 70 | | 60 | | | 20 |
| Thickness T (mm) | | 0.7 | 0.5 | 0.55 | 0.8 | 0.5 | 0.5 | 0.7 | 0.5 | 0.5 | 0.5 | 0.5 |
| Diameter D (inch) | | 12 | 12 | 12 | 12 | 8 | 12 | 12 | 8 | 12 | 12 | 12 |
| Area (cm$^2$) | | 730 | 730 | 730 | 730 | 324 | 730 | 730 | 324 | 730 | 730 | 730 |
| Warpage W (μm) | | 124 | 88 | 42 | 22 | 75 | 150 | 122 | 8.1 | 50 | 30 | 60 |
| Warpage W/diameter D (μm/inch) | | 10 | 7 | 3 | 2 | 9 | 13 | 10 | 1 | 4 | 3 | 5 |
| Thickness deviation (μm) | | | | 2 | 2 | 4 | 4 | | | | | |
| Sag amount S (μm) | | 1.0 | 1.3 | | | | | | | | | |
| S × T$^3$ (μm × mm$^3$) | | 1.0 | 1.3 | | | | | | | | | |
| Inclination angle (within a range of 0.0004° to 0.12°) | | ○ | ○ | ○ | ○ | ○ | ○ | ○ | ○ | ○ | ○ | ○ |

TABLE 2

| | | Example 12 | Example 13 | Example 14 | Example 15 | Example 16 | Example 17 | Example 18 | Example 19 | Example 20 | Example 21 |
|---|---|---|---|---|---|---|---|---|---|---|---|
| Composition (mol %) | $SiO_2$ | 64.2 | 68.0 | 68.4 | 67.0 | 65.8 | 70.2 | 67.0 | 69.6 | 79.8 | 67.2 |
| | $Al_2O_3$ | 8.0 | 10.0 | 8.7 | 13.1 | 6.0 | 4.1 | 5.0 | 2.0 | 1.3 | 4.0 |
| | $B_2O_3$ | | | | 3.8 | 0.0 | 9.9 | 12.0 | | 11.1 | |
| | MgO | 10.5 | 8.0 | 7.1 | 2.3 | 0.0 | 0.0 | 0.0 | 8.2 | | 6.0 |
| | CaO | 0.1 | | 0.5 | 0.0 | 5.3 | 3.6 | 3.6 | 7.2 | | 9.0 |
| | SrO | 0.1 | | | | 9.0 | | | | | 1.0 |
| | BaO | 0.1 | | | | 14.0 | | | | | |
| | ZnO | | | | | | 0.7 | 0.7 | | | |

TABLE 2-continued

| | Example 12 | Example 13 | Example 14 | Example 15 | Example 16 | Example 17 | Example 18 | Example 19 | Example 20 | Example 21 |
|---|---|---|---|---|---|---|---|---|---|---|
| Na₂O | 12.5 | 14.0 | 14.0 | 13.7 | | 11.4 | 11.6 | 12.0 | 6.0 | 7.0 |
| K₂O | 4.0 | 0.0 | 1.3 | 0.1 | | | | 1.0 | 2.0 | 4.5 |
| ZrO₂ | 0.5 | | | | | | | | | 1.3 |
| SnO₂ | | | | | | 0.1 | 0.1 | | | |
| MgO + CaO + SrO + BaO | 10.8 | 8.0 | 7.6 | 2.3 | 28.3 | 3.6 | 3.6 | 15.4 | 0.0 | 16.0 |
| Average thermal expansion coefficient (×10⁻⁷/° C.) | 98 | 80 | 83 | 76 | 71 | 69 | 69 | | | |
| Density (g/cm³) | 2.48 | 2.44 | 2.46 | 2.38 | 3.20 | 2.45 | 2.43 | | | |
| Glass transition temperature Tg (° C.) | 604 | 662 | 595 | 631 | 740 | 576 | 572 | | | |
| Young's modulus (GPa) | 74 | 72 | 72 | 64 | 77 | 77 | 75 | | | |
| T₂ (° C.) | 1601 | 1716 | 1728 | (1769) | 1489 | (1045) | (1050) | | | |
| T₄ (° C.) | 1176 | 1263 | 1269 | (1331) | 1165 | (1545) | (1570) | | | |
| Devitrification temperature (° C.) | | | | | <1130 | 900 | 800 | | | |
| Transmittance [300 nm] (% @1 mmt) | | | | | 50 | 80 | 80 | | | |
| Thickness T (mm) | 0.5 | 0.5 | 0.5 | 0.5 | 0.5 | 0.5 | 0.5 | 0.5 | 0.5 | 0.5 |
| Diameter D (inch) | 12 | 12 | 12 | 12 | 12 | 12 | 12 | 12 | 8 | 8 |
| Area (cm²) | 730 | 730 | 730 | 730 | 730 | 730 | 730 | 730 | 324 | 324 |
| Warpage W (μm) | 100 | 60 | 40 | 30 | 150 | 30 | 50 | 1 | 1 | 400 |
| Warpage W/diameter D (μm/inch) | 8 | 5 | 3 | 3 | 13 | 3 | 4 | 0.1 | 0.1 | 50 |
| Thickness deviation (μm) | | | | | | | | | | |
| Sag amount S (μm) | | | | | | | | | | |
| S × T³ (μm × mm³) | | | | | | | | | | |
| Inclination angle (within a range of 0.0004° to 0.12°) | ○ | ○ | ○ | ○ | ○ | ○ | ○ | x | x | |

In the glass substrates of Examples 1 to 18, the warpage was 2 μm or more, and the inclination angle due to the warpage was within a range of 0.0004° to 0.12°. Accordingly, in the glass substrates of Examples 1 to 18, in the step of sticking the glass substrate and the silicon-containing substrate to each other, bubbles hardly intrude therebetween.

In the glass substrates of Examples 19 and 20, the warpage was less than 2 μm, and the inclination angle due to the warpage was less than 0.0004°. Accordingly, in the glass substrates of Examples 19 and 20, in the step of sticking the glass substrate and the silicon-containing substrate to each other, bubbles easily intrude therebetween.

In the glass substrate of Example 21, the warpage is more than 300 Accordingly, the consistency with the silicon-containing substrate is poor, and therefore, the glass substrate and the silicon-containing substrate are hardly stuck to each other.

While the present invention has been described in detail with reference to specific embodiments thereof, it will be apparent to one skilled in the art that various changes and modifications can be made therein without departing from the spirit and scope thereof. It is to be noted that the present application is based on a Japanese patent application filed on May 28, 2015 (Japanese Patent Application No. 2015-109200), the entireties of which are incorporated by reference.

INDUSTRIAL APPLICABILITY

According to the present invention, a glass substrate can be provided in which in a step of sticking the glass substrate and a silicon-containing substrate to each other, bubbles hardly intrude therebetween. In addition, the glass substrate can be suitably used as a supporting glass substrate for a fun-out type wafer-level package. Additionally, the glass substrate can be suitably used as a glass substrate for image sensors, such as MEMS, CMOS and CIS, for which miniaturization of element due to a wafer-level package is effective, a bored substrate of a glass interposer (GIP) and a support glass for semiconductor back-grinding.

DESCRIPTION OF REFERENCE NUMERALS AND SIGNS

10: Substrate
20: Resin
30: Laminated substrate
G1: Glass substrate

The invention claimed is:
1. A laminated substrate, comprising:
    a glass substrate having a warpage of 2 μm to 300 μm and an inclination angle due to the warpage of 0.0004° to 0.12°; and
    a silicon-containing substrate,
    wherein two or more of the glass substrates are laminated.
2. The laminated substrate according to claim 1, wherein the glass substrate has an area of one main surface thereof of 70 cm² to 2000 cm².
3. The laminated substrate according to claim 2, wherein the glass substrate has a circular shape.
4. The laminated substrate according to claim 3, wherein the glass substrate has a value W/D given by dividing the warpage W (unit: μm) by the diameter D (unit: inch) of 0.33 to 25.
5. The laminated substrate according to claim 2, wherein the glass substrate has a Young's modulus of 65 GPa or more.
6. The laminated substrate according to claim 1, wherein the glass substrate has a circular shape.
7. The laminated substrate according to claim 6, wherein the glass substrate has a value W/D given by dividing the warpage W (unit: μm) by the diameter D (unit: inch) of 0.33 to 25.
8. The laminated substrate according to claim 6, wherein the class substrate has a Young's modulus of 65 GPa or more.

9. The laminated substrate according to claim 1, wherein the glass substrate has a Young's modulus of 65 GPa or more.

10. The laminated substrate according to claim 1, wherein a shape of a cross section orthogonal to one main surface of the glass substrate and passing through a center of gravity of the one main surface is concave, and a shape of a cross section passing through the center of gravity of the one main surface and orthogonal to the cross section and the one main surface is convex.

11. The laminated substrate according to claim 1, wherein a shape of a cross section orthogonal to one main surface of the glass substrate and passing through a center of gravity of the one main surface is concave, and a shape of a cross section passing through the center of gravity of the one main surface and orthogonal to the cross section and the one main surface is concave.

12. The laminated substrate according to claim 1, wherein the class substrate comprises, as expressed in terms of molar percentage based on oxides, $SiO_2$: 50% to 75%,
$Al_2O_3$: 0% to 16%,
$B_2O_3$: 0% to 15%,
MgO: 0% to 18%,
CaO: 0% to 13%,
SrO: 0% to 11%,
BaO: 0% to 15%,
$Na_2O$: 0% to 17%, and
$K_2O$: 0% to 15%.

13. The laminated substrate according to claim 1, wherein the glass substrate has a β-OH of 0.05 $mm^{-1}$ to 0.65 $mm^{-1}$.

14. The laminated substrate according to claim 1, wherein the class substrate has a thickness deviation of 1 μm to 15 μm.

15. The laminated substrate according to claim 1, wherein the glass substrate has an average thermal expansion coefficient at 50° C. to 350° C. of 30 ($\times 10^{-7}$/° C.) to 120 ($\times 10^{-7}$/° C.).

16. The laminated substrate according to claim 1, wherein a light shielding film is formed on the main surface of the glass substrate.

17. The laminated substrate according to claim 1, wherein the glass substrate has a warpage of 2 μm to 200 μm.

* * * * *

UNITED STATES PATENT AND TRADEMARK OFFICE
CERTIFICATE OF CORRECTION

PATENT NO. : 10,515,864 B2
APPLICATION NO. : 15/822859
DATED : December 24, 2019
INVENTOR(S) : Yu Hanawa et al.

Page 1 of 1

It is certified that error appears in the above-identified patent and that said Letters Patent is hereby corrected as shown below:

On the Title Page

Item (71), the Applicant is incorrect. Item (71) should read:
-- (71) Applicant: AGC Inc., Tokyo (JP) --

Signed and Sealed this
First Day of December, 2020

Andrei Iancu
*Director of the United States Patent and Trademark Office*